US012672553B2

(12) United States Patent
Lee et al.

(10) Patent No.: US 12,672,553 B2
(45) Date of Patent: Jun. 30, 2026

(54) ELECTRONIC PACKAGE HAVING A CHIP WITH A TRENCH IN THE SURFACE

(71) Applicant: SILICONWARE PRECISION INDUSTRIES CO., LTD., Taichung City (TW)

(72) Inventors: Che-Yu Lee, Taichung City (TW);
Chi-Ching Ho, Taichung City (TW);
Chao-Chiang Pu, Taichung City (TW);
Yi-Min Fu, Taichung City (TW);
Po-Yuan Su, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 473 days.

(21) Appl. No.: 18/352,952

(22) Filed: Jul. 14, 2023

(65) Prior Publication Data

US 2024/0363545 A1      Oct. 31, 2024

(30) Foreign Application Priority Data

Apr. 27, 2023     (TW) .................................. 112115810

(51) Int. Cl.
| | |
|---|---|
| *H10W 46/00* | (2026.01) |
| *H10D 84/07* | (2025.01) |
| *H10W 90/00* | (2026.01) |
| *H10W 72/90* | (2026.01) |

(52) U.S. Cl.
CPC ............ *H10W 46/00* (2026.01); *H10D 84/07* (2025.01); *H10W 90/701* (2026.01); *H10W* 46/501 (2026.01); *H10W 46/603* (2026.01); *H10W 46/607* (2026.01); *H10W 72/967* (2026.01)

(58) Field of Classification Search
CPC .... H10D 84/07; H10D 62/117; H01L 23/544; H01L 23/49816; H01L 23/49811; H01L 25/0657; H01L 24/09; H01L 24/06; H01L 2225/1058; H10W 90/00; H10W 46/00; H10W 90/701
See application file for complete search history.

(56) References Cited

U.S. PATENT DOCUMENTS

| | | | |
|---|---|---|---|
| 2011/0003433 A1* | 1/2011 | Harayama ............. | H01L 21/561 |
| | | | 257/E21.499 |
| 2014/0117555 A1* | 5/2014 | Liang ................ | H01L 23/49827 |
| | | | 438/126 |

\* cited by examiner

*Primary Examiner* — Alonzo Chambliss
(74) *Attorney, Agent, or Firm* — Studebaker Brackett PLLC

(57)     ABSTRACT

An electronic package and a manufacturing method thereof are provided, in which a full-panel wafer is provided and includes a plurality of electronic bodies arranged in an array at intervals, a plurality of trenches are formed across the electronic bodies along a first direction on the full-panel wafer, so that the trenches on a single electronic body are arranged parallel to each other at interval and along a second direction perpendicular to the first direction. Then, in a singulation process, any trench can be selected for cutting to obtain a plurality of electronic elements of a required size. Finally, each of the electronic elements is disposed on a packaging region of a carrier structure, so that each of the electronic elements is electrically connected to at least a portion of electrical contact pads in the packaging region.

18 Claims, 4 Drawing Sheets

ELECTRONIC PACKAGE HAVING A CHIP WITH A TRENCH IN THE SURFACE

BACKGROUND

1. Technical Field

The present disclosure relates to a packaging process, and more particularly, to an electronic package and a manufacturing method thereof.

2. Description of Related Art

With the development of the electronic industry, electronic products nowadays are designed to be thinner, smaller and more functional. Semiconductor packaging technology has also developed different packaging types, for example, chip scale package (CSP), direct chip attached (DCA), multi-chip module (MCM), and other flip-chip packaging modules.

At present, according to the requirements of electronic products, it is necessary to use semiconductor chips of different sizes, and for semiconductor chips of different sizes, it is necessary to develop a variety of matching cutting masks according to various chip sizes, so as to perform singulation processes with different cutting paths.

However, in the conventional singulation process, the production cost of the cutting mask is extremely high. If a cutting mask is developed according to each chip size, it is difficult to reduce the production cost of the semiconductor chip, resulting in an inability to reduce the overall cost of electronic packages using the semiconductor chip.

Therefore, there is a need for a solution that addresses the aforementioned shortcomings in the prior art.

SUMMARY

In view of the aforementioned shortcomings of the prior art, the present disclosure provides an electronic package, which comprises: a carrier structure with a surface thereof being defined with a packaging region, wherein the packaging region has a plurality of electrical contact pads therein; and an electronic element having an active surface and an inactive surface opposing the active surface, wherein the active surface has a plurality of electrode pads, and the electronic element is electrically connected to at least a portion of the plurality of electrical contact pads via the plurality of electrode pads thereof.

The present disclosure also provides a method for manufacturing an electronic package, the method comprises: providing a full-panel wafer comprising a plurality of electronic bodies arranged in an array at intervals, wherein each of the electronic bodies has an active surface and an inactive surface opposing the active surface, the active surface has a plurality of electrode pads, and a plurality of trenches across each of the electronic bodies along a first direction are formed on the full-panel wafer, wherein the plurality of trenches on each of the electronic bodies are arranged parallel to each other at interval and along a second direction perpendicular to the first direction; selecting one of the plurality of trenches to perform a singulation process to obtain a plurality of electronic elements; and disposing each of the electronic elements on a carrier structure, and a surface of the carrier structure being defined with a packaging region, wherein the packaging region has a plurality of electrical contact pads therein, and each of the electronic elements is electrically connected to at least a portion of the plurality of electrical contact pads via the plurality of electrode pads thereof.

In the aforementioned electronic package and method, the active surface of the electronic element has at least one trench or the active surface of the electronic element has no trench. For example, the trench is a pre-cut line without penetrating through the electronic element. Alternatively, the at least one trench is a plurality of trenches, and at least one of the plurality of electrode pads is disposed between any two of the plurality of trenches.

In the aforementioned electronic package and method, the plurality of electrode pads of the electronic element are bonded to at least the portion of the plurality of electrical contact pads via a plurality of conductive bumps.

In the aforementioned electronic package and method, a quantity of the electrode pads is less than or equal to a quantity of the electrical contact pads.

In the aforementioned electronic package and method, another portion of the plurality of electrical contact pads is free from being electrically connected to the electrode pads.

In the aforementioned electronic package and method, an area of the active surface of the electronic element is less than or equal to an area of the packaging region. For example, the area of the active surface of the electronic element is equal to the area of the packaging region, so that the entire packaging region is covered by the electronic element. Alternatively, the area of the active surface of the electronic element is less than the area of the packaging region, so that a portion of a surface of the packaging region is exposed.

As can be understood from the above, in the electronic package and the manufacturing method thereof according to the present disclosure, the full-panel wafer is designed with a plurality of trenches formed on each electronic body, so that the trench corresponding to the required chip size is selected for singulation process. As such, electronic elements of various sizes can be cut by simply designing a mask with multiple cutting lines. Therefore, compared with the prior art, in the manufacturing method of the present disclosure, there is no need to design a variety of masks with corresponding cutting lines according to the sizes of various electronic elements, so that the cost of manufacturing the electronic package can be reduced.

DETAILED DESCRIPTION

Figure 1:
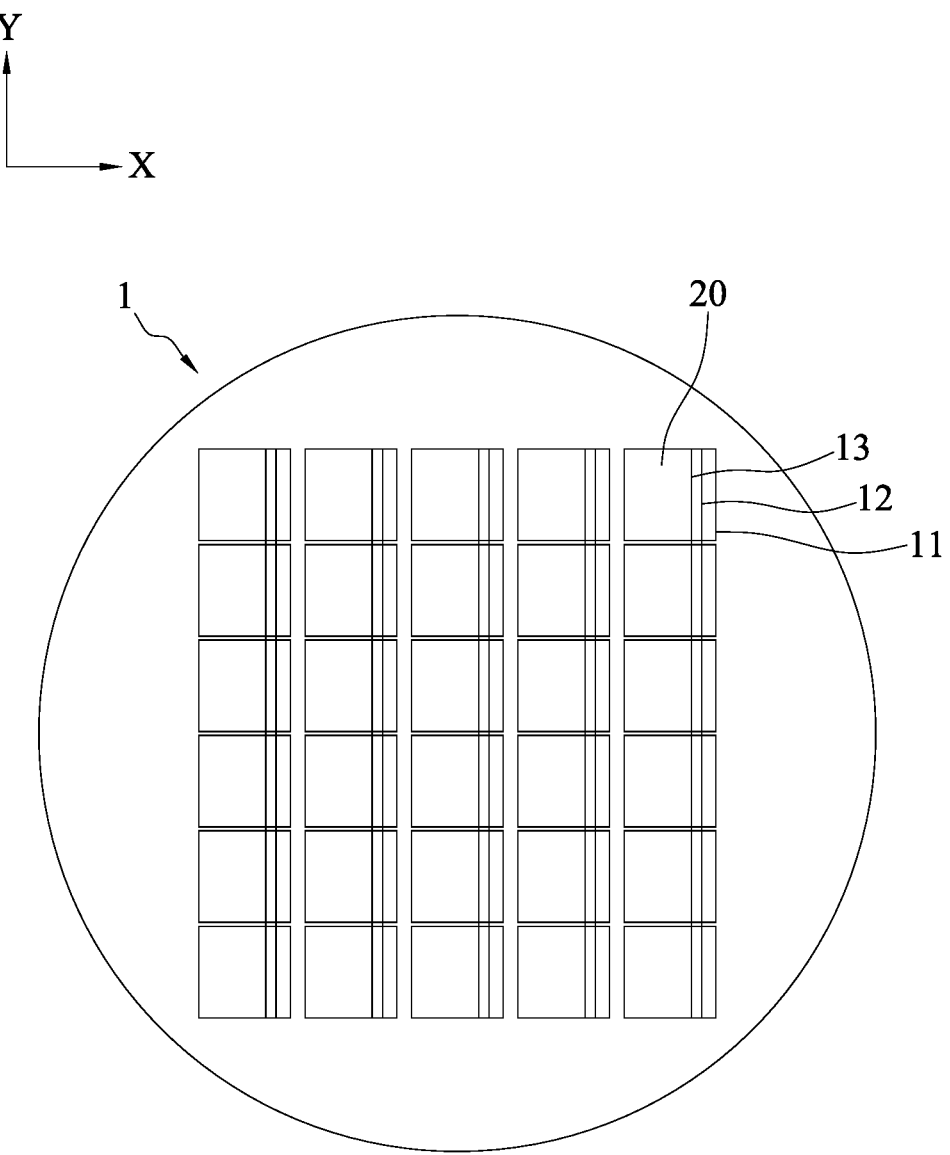
FIG. 1 is a schematic partial top view illustrating the manufacturing method of the electronic package of the present disclosure.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "first," "second," "third," "a," "one" and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 1 to FIG. 3C are schematic views illustrating the manufacturing method of an electronic package 3a, 3b, 3c of the present disclosure.

As shown in FIG. 1, a full-panel wafer 1 is provided and comprises a plurality of electronic bodies 20 arranged in an array at intervals, and a plurality of trenches (i.e., a first trench 11, a second trench 12 and a third trench 13) are formed on the full-panel wafer 1 along a first direction Y across each of the electronic bodies 20, and the first trench 11, the second trench 12 and the third trench 13 on a single electronic body 20 are arranged in parallel with each other at interval and along a second direction X perpendicular to the first direction Y in sequence.

In an embodiment, the electronic body 20 is an active element or a passive element, and the active element is a semiconductor chip, while the passive element is for example a resistor, a capacitor, or an inductor.

Moreover, the first trenches 11, the second trenches 12 and the third trenches 13 are pre-cut lines and are free from penetrating through the full-panel wafer 1 or the electronic bodies 20.

Also, the first direction Y is the up-down direction, and the second direction X is the left-right direction, so that the first trenches 11, the second trenches 12 and the third trenches 13 are arranged from right to left at interval and in sequence on a single row of the electronic bodies 20.

Figure 2A:
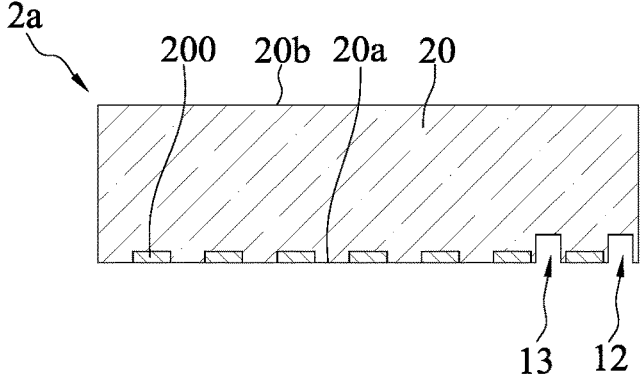
FIG. 2A is a schematic partial cross-sectional view illustrating the manufacturing method of the electronic package of the present disclosure.
Figure 2B:
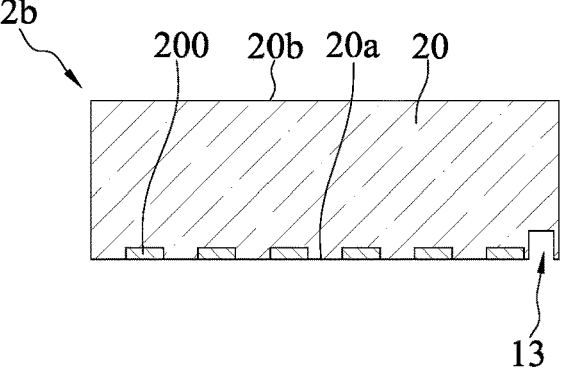
FIG. 2B and FIG. 2C are schematic cross-sectional views showing different aspects of FIG. 2A.
Figure 2C:
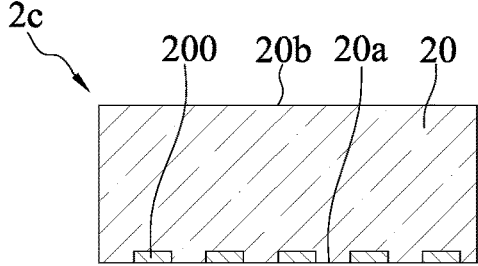

As shown in FIG. 2A, FIG. 2B and FIG. 2C, the first trench 11, the second trench 12, or the third trench 13 are selected for singulation process according to requirements, so as to obtain a first electronic element 2a, a second electronic element 2b, or a third electronic element 2c of different sizes.

In an embodiment, the first electronic element 2a, the second electronic element 2b and the third electronic element 2c are semiconductor chips, and the electronic body 20 of the first electronic element 2a, the second electronic element 2b, or the third electronic element 2c has an active surface 20a and an inactive surface 20b opposing the active surface 20a, and a plurality of electrode pads 200 are formed on the active surface 20a.

Furthermore, the first electronic element 2a as shown in FIG. 2A is obtained if the full-panel wafer 1 is cut along the first trenches 11, and the second trench 12 and the third trench 13 are remained on the active surface 20a of the first electronic element 2a. For example, a portion of the electrode pads 200 is disposed between the second trench 12 and the third trench 13.

Alternatively, the second electronic element 2b as shown in FIG. 2B is obtained if the full-panel wafer 1 is cut along the second trenches 12, wherein the third trench 13 is remained on the active surface 20a of the second electronic element 2b, and the electrode pads 200 are not remained between the second trench 12 and the third trench 13.

On the other hand, the third electronic element 2c as shown in FIG. 2C is obtained if the full-panel wafer 1 is cut along the third trenches 13, and there is no first trench 11, second trench 12, third trench 13 on the active surface 20a of the third electronic element 2c. Therefore, a size of the first electronic element 2a (e.g., an area D1 of the active surface 20a shown in FIG. 3A) is greater than a size of the second electronic element 2b (e.g., an area D2 of the active surface 20a shown in FIG. 3B), and the size of the second electronic element 2b (e.g., the area D2 of the active surface 20a shown in FIG. 3B) is greater than a size of the third electronic element 2c (e.g., an area D3 of the active surface 20a shown in FIG. 3C).

Figure 3A:
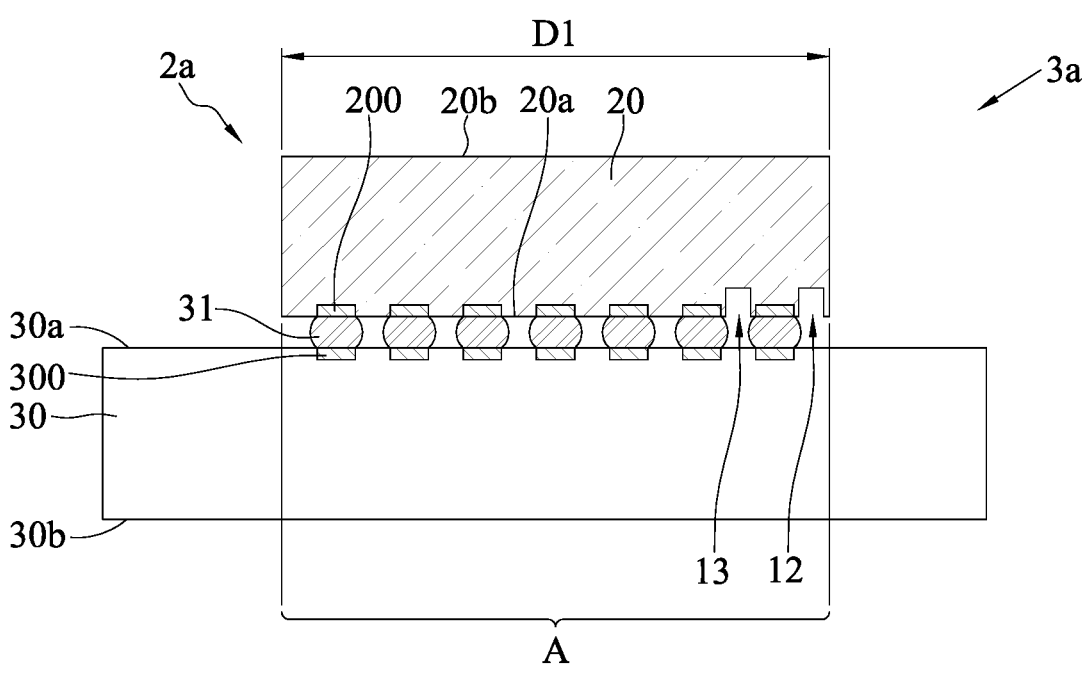
FIG. 3A is a schematic partial cross-sectional view illustrating the manufacturing method of the electronic package of the present disclosure.
Figure 3B:
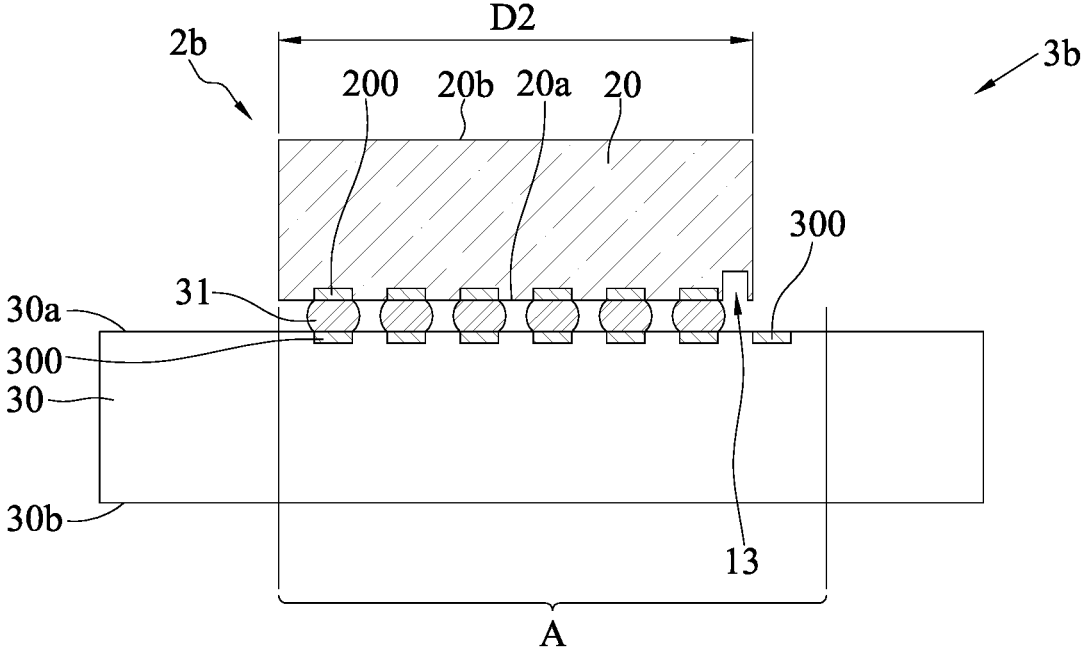
FIG. 3B and FIG. 3C are schematic cross-sectional views showing different aspects of FIG. 3A.
Figure 3C:
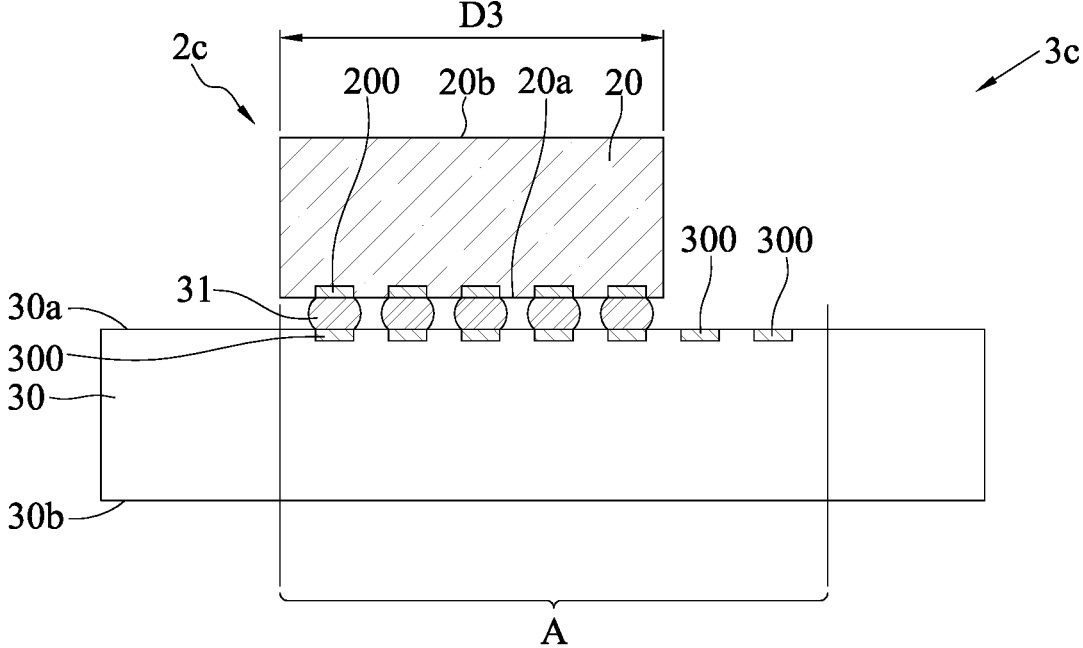

As shown in FIG. 3A, FIG. 3B and FIG. 3C, the first electronic element 2a, the second electronic element 2b, or the third electronic element 2c is arranged on a carrier structure 30 to form the electronic package 3a, the electronic package 3b, or the electronic package 3c respectively, wherein the first electronic element 2a is electrically connected to all of a plurality of electrical contact pads 300 of the carrier structure 30 via the electrode pads 200 thereof, and the second electronic element 2b or the third electronic element 2c is electrically connected to some of the plurality of electrical contact pads 300 via the electrode pads 200 thereof.

In an embodiment, the carrier structure 30 is, for example, a package substrate with a core layer and a circuit portion or a coreless package substrate, and the carrier structure 30 comprises at least one dielectric layer and a circuit layer formed on the dielectric layer, such as of a fan-out type redistribution layer (RDL) specification.

In addition, the carrier structure 30 has a first side 30a and a second side 30b opposing the first side 30a, and the carrier structure 30 is defined with a packaging region A on a surface of the first side 30a, so that the circuit layer in the packaging region A has the plurality of electrical contact pads 300. For example, the first side 30a is served as a die placement side, and the second side 30b is served as a ball placement side.

Also, each of the first to third electronic elements 2a, 2b, 2c is bonded and electrically connected to at least some of the electrical contact pads 300 of the circuit layer of the carrier structure 30 with the electrode pads 200 via a plurality of conductive bumps 31 (such as solder materials) in a manner of flip-chip. For example, a quantity of the electrode pads 200 of the first electronic element 2a is equal to a quantity of the electrical contact pads 300 of the carrier structure 30; or, the quantity of the electrode pads 200 of the second electronic element 2b or the third electronic element 2c is less than the quantity of the electrical contact pads 300 of the carrier structure 30, such that a portion of the plurality of electrical contact pads 300 is free from being electrically connected to the conductive bumps 31 or the electrode pads 200, as shown in FIG. 3B or FIG. 3C.

Moreover, the area D1 of the active surface 20a of the first electronic element 2a is greater than or equal to the area of the packaging region A to cover the entire packaging region A; or, the area D2 of the active surface 20a of the second electronic element 2*b* or the area D3 of the active surface 20*a* of the third electronic element 2*c* is less than the area of the packaging region A, so that a portion of the surface of the packaging region A is exposed to expose a portion of the electrical contact pads 300 in the packaging region A.

It should be understood that an underfill (not shown) can be filled and formed between the first side 30*a* of the carrier structure 30 and the active surface 20*a* according to requirements, so as to cover the conductive bumps 31.

Furthermore, a plurality of solder balls (not shown) can be placed on the second side 30*b* of the carrier structure 30 to connect the electronic package 3*a*, 3*b*, 3*c* to an electronic device (not shown) such as a circuit board.

Therefore, in the manufacturing method of the present disclosure, the full-panel wafer 1 is designed with a plurality of trenches (e.g., the first trench 11, the second trench 12 and the third trench 13) formed on each electronic body 20, so that the trench corresponding to the required chip size is selected for singulation process. As such, chips of various sizes (e.g., the first electronic element 2*a*, the second electronic element 2*b*, or the third electronic element 2*c*) can be cut by simply designing a mask with multiple cutting lines. Therefore, compared with the prior art, in the manufacturing method of the present disclosure, there is no need to design a variety of masks with corresponding cutting lines according to various chip sizes, so that the cost of manufacturing the electronic package 3*a*, 3*b*, 3*c* can be reduced.

In addition, the first electronic element 2*a*, the second electronic element 2*b* and the third electronic element 2*c* are each made with the electronic body 20 of the same size, so that the first electronic element 2*a*, the second electronic element 2*b* and the third electronic element 2*c* can be commonly used in the same layout pattern of the circuit layer of the carrier structure 30 (such as the arrangement of the electrical contact pads 300 in the packaging region A). As such, the carrier structure 30 is merely required to be designed with a circuit layer having a layout pattern (or the arrangement of the electrical contact pads 300 in the packaging region A), so that the first electronic element 2*a*, the second electronic element 2*b*, or the third electronic element 2*c* can be connected to the carrier structure 30, and there is no need to design circuit layers with different layout patterns (or the arrangement of the electrical contact pads 300 in the packaging region A) according to the sizes of different electronic elements. Thus, the cost of pattern mask for fabricating the circuit layer (or the plurality of electrical contact pads 300) can be saved, so as to effectively save the cost of manufacturing the electronic package 3*a*, 3*b*, 3*c*.

The present disclosure provides an electronic package 3*a*, 3*b*, 3*c*, which comprises: a carrier structure 30 and an electronic element (one of a first electronic element 2*a*, a second electronic element 2*b* and a third electronic element 2*c*).

A surface of the carrier structure 30 is defined with a packaging region A, and the packaging region A has a plurality of electrical contact pads 300 therein.

The electronic element (one of the first electronic element 2*a*, the second electronic element 2*b* and the third electronic element 2*c*) has an active surface 20*a* and an inactive surface 20*b* opposing the active surface 20*a*, and a plurality of electrode pads 200 are formed on the active surface 20*a*, so that the electronic element (one of the first electronic element 2*a*, the second electronic element 2*b* and the third electronic element 2*c*) is electrically connected to at least a portion of the plurality of electrical contact pads 300 via the plurality of electrode pads 200 of the electronic element (one of the first electronic element 2*a*, the second electronic element 2*b* and the third electronic element 2*c*).

In one embodiment, at least one trench (a second trench 12 and/or a third trench 13) is formed on the active surface 20*a* of the first and second electronic elements 2*a*, 2*b*, or there is no trench formed on the active surface 20*a* of the third electronic element 2*c*. For example, the trenches (the second trench 12 and the third trench 13) are pre-cut lines and are free from penetrating through the first and second electronic elements 2*a*, 2*b*. Alternatively, the at least one trench is a plurality of trenches (the second trench 12 and the third trench 13), so that at least one of the plurality of electrode pads 200 is disposed between any two of the plurality of trenches (the second trench 12 and the third trench 13).

In one embodiment, the plurality of electrode pads 200 of the electronic element (one of the first electronic element 2*a*, the second electronic element 2*b* and the third electronic element 2*c*) is bonded to at least a portion of the plurality of electrical contact pads 300 via a plurality of conductive bumps 31.

In one embodiment, a quantity of the electrode pads 200 is less than or equal to a quantity of the electrical contact pads 300.

In one embodiment, a portion of the plurality of electrical contact pads 300 is free from being electrically connected to the electrode pads 200.

In one embodiment, an area D1, D2, D3 of the active surface 20*a* of the electronic element (one of the first electronic element 2*a*, the second electronic element 2*b* and the third electronic element 2*c*) is less than or equal to an area of the packaging region A. For example, the area D1 of the active surface 20*a* of the first electronic element 2*a* is equal to the area of the packaging region A, so that the first electronic element 2*a* covers the entire packaging region A. Alternatively, the area D2 of the active surface 20*a* of the second electronic element 2*b* or the area D3 of the active surface 20*a* of the third electronic element 2*c* is less than the area of the packaging region A, so that a portion of a surface of the packaging region A is exposed.

In view of the above, in the electronic package and the manufacturing method thereof according to the present disclosure, the full-panel wafer is designed with a plurality of trenches formed on each electronic body, so that the trench corresponding to the required chip size is selected for singulation process. As such, electronic elements of various sizes can be cut by simply designing a mask with multiple cutting lines. Therefore, in the manufacturing method of the present disclosure, there is no need to design a variety of masks with corresponding cutting lines according to the sizes of various electronic elements, so that the cost of manufacturing the electronic package can be reduced.

Furthermore, the first electronic element, the second electronic element and the third electronic element are each made with the electronic body of the same size, so that the first electronic element, the second electronic element and the third electronic element can be commonly used in the same arrangement of the electrical contact pads in the packaging region. As such, the carrier structure is merely required to be designed with a layout arrangement of the electrical contact pads, so that the first electronic element, the second electronic element, or the third electronic element can be connected to the carrier structure, and there is no need to design the electrical contact pads with different layout arrangements according to the sizes of different electronic elements. Thus, the cost of pattern mask for fabricating the electrical contact pads can be saved, so as to effectively save the cost of manufacturing the electronic package.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
a carrier structure with a surface thereof being defined with a packaging region, wherein the packaging region has a plurality of electrical contact pads therein; and
an electronic element having an active surface and an inactive surface opposing the active surface, wherein the active surface has a plurality of electrode pads, and the electronic element is electrically connected to at least a portion of the plurality of electrical contact pads via the plurality of electrode pads thereof,
wherein the active surface of the electronic element has at least one trench.

2. The electronic package of claim 1, wherein the trench is a pre-cut line without penetrating through the electronic element.

3. The electronic package of claim 1, wherein the at least one trench is a plurality of trenches, and at least one of the plurality of electrode pads is disposed between any two of the plurality of trenches.

4. The electronic package of claim 1, wherein the plurality of electrode pads of the electronic element are bonded to at least the portion of the plurality of electrical contact pads via a plurality of conductive bumps.

5. The electronic package of claim 1, wherein a quantity of the electrode pads is less than or equal to a quantity of the electrical contact pads.

6. The electronic package of claim 1, wherein another portion of the plurality of electrical contact pads is free from being electrically connected to the electrode pads.

7. The electronic package of claim 1, wherein an area of the active surface of the electronic element is less than or equal to an area of the packaging region.

8. The electronic package of claim 7, wherein the area of the active surface of the electronic element is equal to the area of the packaging region, so that the entire packaging region is covered by the electronic element.

9. The electronic package of claim 7, wherein the area of the active surface of the electronic element is less than the area of the packaging region, so that a portion of a surface of the packaging region is exposed.

10. A method for manufacturing an electronic package, the method comprising:

providing a full-panel wafer comprising a plurality of electronic bodies arranged in an array at intervals, wherein each of the electronic bodies has an active surface and an inactive surface opposing the active surface, the active surface has a plurality of electrode pads, and a plurality of trenches across each of the electronic bodies along a first direction are formed on the full-panel wafer, wherein the plurality of trenches on each of the electronic bodies are arranged parallel to each other at interval and along a second direction perpendicular to the first direction, wherein the active surface of the electronic element has at least one trench of the plurality of trenches;
selecting one of the plurality of trenches to perform a singulation process to obtain a plurality of electronic elements; and
disposing each of the electronic elements on a carrier structure, wherein a surface of the carrier structure is defined with a packaging region, the packaging region has a plurality of electrical contact pads therein, and each of the electronic elements is electrically connected to at least a portion of the plurality of electrical contact pads via the plurality of electrode pads thereof.

11. The method of claim 10, wherein the trench is a pre-cut line without penetrating through each of the electronic elements.

12. The method of claim 10 wherein the at least one trench is a plurality of trenches, and at least one of the plurality of electrode pads is disposed between any two of the plurality of trenches.

13. The method of claim 10, wherein the plurality of electrode pads of each of the electronic elements are bonded to at least the portion of the plurality of electrical contact pads via a plurality of conductive bumps.

14. The method of claim 10, wherein a quantity of the electrode pads is less than or equal to a quantity of the electrical contact pads.

15. The method of claim 10, wherein another portion of the plurality of electrical contact pads is free from being electrically connected to the electrode pads.

16. The method of claim 10, wherein an area of the active surface of each of the electronic elements is less than or equal to an area of the packaging region.

17. The method of claim 16, wherein the area of the active surface of each of the electronic elements is equal to the area of the packaging region, so that the entire packaging region is covered by each of the electronic elements.

18. The method of claim 16, wherein the area of the active surface of each of the electronic elements is less than the area of the packaging region, so that a portion of a surface of the packaging region is exposed.

* * * * *